United States Patent
Yang et al.

(10) Patent No.: US 10,084,028 B2
(45) Date of Patent: Sep. 25, 2018

(54) METHOD FOR MANUFACTURING DISPLAY SUBSTRATE, DISPLAY SUBSTRATE AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Fan Yang, Beijing (CN); Kun Guo, Beijing (CN); Tianyi Cheng, Beijing (CN); Yi Zhang, Beijing (CN); Yuqing Yang, Beijing (CN); Liman Peng, Beijing (CN); Yan Wu, Beijing (CN); Wenbin Yang, Beijing (CN); Qi Liu, Beijing (CN); Weilin Lai, Beijing (CN); Liangliang Liu, Beijing (CN); Zhiyong Yang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/539,986

(22) PCT Filed: Jan. 10, 2017

(86) PCT No.: PCT/CN2017/070715
§ 371 (c)(1),
(2) Date: Jun. 26, 2017

(87) PCT Pub. No.: WO2017/173874
PCT Pub. Date: Oct. 12, 2017

(65) Prior Publication Data
US 2018/0090548 A1 Mar. 29, 2018

(30) Foreign Application Priority Data

Apr. 8, 2016 (CN) .......................... 2016 1 0218186

(51) Int. Cl.
*H01L 27/32* (2006.01)
(52) U.S. Cl.
CPC ...... *H01L 27/3246* (2013.01); *H01L 27/3248* (2013.01); *H01L 27/326* (2013.01)
(58) Field of Classification Search
None
See application file for complete search history.

(56) References Cited

U.S. PATENT DOCUMENTS

| 6,417,034 B2 | 7/2002 | Kitazume et al. |
| 2004/0221806 A1 | 11/2004 | Kim |

(Continued)

FOREIGN PATENT DOCUMENTS

| CN | 1551687 A | 12/2004 |
| CN | 103887321 A | 6/2014 |

(Continued)

OTHER PUBLICATIONS

International Search Report and Written Opinion in PCT/CN2017/070715 dated Apr. 5, 2017, with English translation.

(Continued)

*Primary Examiner* — Asok K Sarkar
(74) *Attorney, Agent, or Firm* — Womble Bond Dickinson (US) LLP

(57) ABSTRACT

A method for manufacturing a display substrate comprises: forming a pixel definition layer on a lower surface of a base so as to define a pixel area; forming a spacer on a lower surface of the pixel definition layer; arranging a mask plate under the spacer; and moving an evaporation source along a first direction parallel to the lower surface of the base, so as to form an organic light emitting layer in the pixel area.

(Continued)

When the evaporation source starts forming the organic light emitting layer in the pixel area, the spacer and the mask plate do not block a first border of the evaporation area. Further, when the evaporation source stops forming the organic light emitting layer in the pixel area, the spacer and the mask plate do not block a second border of the evaporation area.

8 Claims, 6 Drawing Sheets

(56)  References Cited

U.S. PATENT DOCUMENTS

2014/0319478 A1   10/2014   Joo et al.
2017/0104042 A1    4/2017   Wang et al.

FOREIGN PATENT DOCUMENTS

| | | |
|---|---|---|
| CN | 104752490 A | 7/2015 |
| CN | 105070651 A | 11/2015 |
| CN | 105154823 A | 12/2015 |
| CN | 105655382 A | 6/2016 |
| JP | 2011054290 A | 3/2011 |
| KR | 20140081314 | 7/2014 |

OTHER PUBLICATIONS

Office Action received for Chinese Patent Application No. 201610218186.7, dated Feb. 2, 2018, 11 pages (5 pages of English Translation and 6 pages of Office Action).
"Notice of Preliminary Rejection," KR Application No. 10-2017-7018007 (dated Jun. 1, 2018).

METHOD FOR MANUFACTURING DISPLAY SUBSTRATE, DISPLAY SUBSTRATE AND DISPLAY DEVICE

The present application is the U.S. national phase entry of PCT/CN2017/070715, with an international filing date of Jan. 10, 2017, which claims the benefit of Chinese Patent Application No. 201610218186.7, filed on Apr. 8, 2016, the entire disclosure of which is incorporated herein by reference.

TECHNICAL FIELD

The present disclosure relates to the field of display technology, particularly to a method for manufacturing a display substrate, a display substrate and a display device.

BACKGROUND

In a manufacturing process of an organic light emitting diode (OLED) display, an evaporation process is generally used to form an organic light emitting layer. According to the evaporation method in the prior art, the organic light emitting layer has a cross-sectional shape with a relatively thick middle area and relatively thin side areas. This enables the organic light emitting layer to have a non-uniform thickness. For a single pixel formed, this may result in different light emitting brightness in different areas. While for a plurality of pixels, this may result in problems such as color mixture (or color bias).

SUMMARY

According to an aspect of the present disclosure, a method for manufacturing a display substrate is provided. The method comprises: forming a pixel definition layer on a lower surface of a base so as to define a pixel area; forming a spacer on a lower surface of the pixel definition layer; arranging a mask plate under the spacer; and moving an evaporation source along a first direction parallel to the lower surface of the base, so as to form an organic light emitting layer in the pixel area. An acute angle between a side surface of the pixel definition layer in the first direction for defining the pixel area and the lower surface of the base is a first angle. An acute angle between a border of an evaporation area of the evaporation source in the first direction and the lower surface of the base is a second angle, wherein the second angle is greater than or equal to the first angle. When the evaporation source is moved in the first direction so as to start forming the organic light emitting layer in the pixel area, the spacer under the pixel definition layer and the mask plate under the spacer do not block a first border of the evaporation area. Further, when the evaporation source is moved in the first direction so as to stop forming the organic light emitting layer in the pixel area, the spacer under the pixel definition layer and the mask plate under the spacer do not block a second border of the evaporation area.

According to an embodiment of the present disclosure, the evaporation source can be a linear source extending along a second direction parallel to the lower surface of the base and perpendicular to the first direction. Besides, baffles can be arranged at two sides of the evaporation source, for enabling the acute angle between the border of the evaporation area in the first direction and the lower surface of the base to be the second angle.

According to an embodiment of the present disclosure, side surfaces of the pixel definition layer and the spacer formed there-under in the second direction can be perpendicular to the lower surface of the base.

According to an embodiment of the present disclosure, the second angle can be equal to the first angle.

According to an embodiment of the present disclosure, the method can further comprise: prior to forming the organic light emitting layer, forming a first electrode on the lower surface of the base, and after forming the organic light emitting layer, forming a second electrode on a lower surface of the organic light emitting layer.

According to another aspect of the present disclosure, a display substrate is provided. The display substrate comprises: a base; a pixel definition layer formed on a lower surface of the base, for defining a pixel area; a spacer formed on a lower surface of the pixel definition layer; and an organic light emitting layer formed in the pixel area. An acute angle between a side surface of the pixel definition layer in a first direction parallel to the lower surface of the base for defining the pixel area and the lower surface of the base is a first angle. Further, a cross section of the organic light emitting layer perpendicular to the lower surface of the base and parallel to the first direction is a trapezoid, wherein a side length thereof close to the lower surface of the base is less than a side length thereof away from the lower surface of the base.

According to an embodiment of the present disclosure, side surfaces of the pixel definition layer and the spacer formed there-under in a second direction parallel to the lower surface of the base and perpendicular to the first direction can be perpendicular to the lower surface of the base.

According to an embodiment of the present disclosure, the display substrate can further comprise: a first electrode arranged between the lower surface of the base and the organic light emitting layer; and a second electrode arranged on a lower surface of the organic light emitting layer.

According to a further aspect of the present disclosure, a display device is provided. The display device comprises the display substrate according to any of the above embodiments of the present disclosure.

BRIEF DESCRIPTION OF THE DRAWINGS

The features and advantages of the present disclosure will be understood more clearly by making reference to the drawings. The drawings are schematic and should not be understood as any limitations to the present disclosure. In the drawings.

DETAILED DESCRIPTION

In order to understand the above objects, features and advantages of the present disclosure more clearly, embodiments of the present disclosure will be described in more details as follows with reference to the drawings and the specific implementations. It shall be noted that the features described in each embodiment of the present disclosure can be applied in other embodiments of the present disclosure in case of not conflicting.

Many details will be elaborated in the following so as to facilitate sufficient understanding of the present disclosure. However, the present disclosure can also be carried out using other ways different from those described here. Therefore, the protection scope of the present disclosure is not limited by the specific embodiments to be disclosed below.

FIG. 1 to FIG. 4 show schematic views of an organic light emitting layer formed through evaporation in the prior art.

Figure 1:
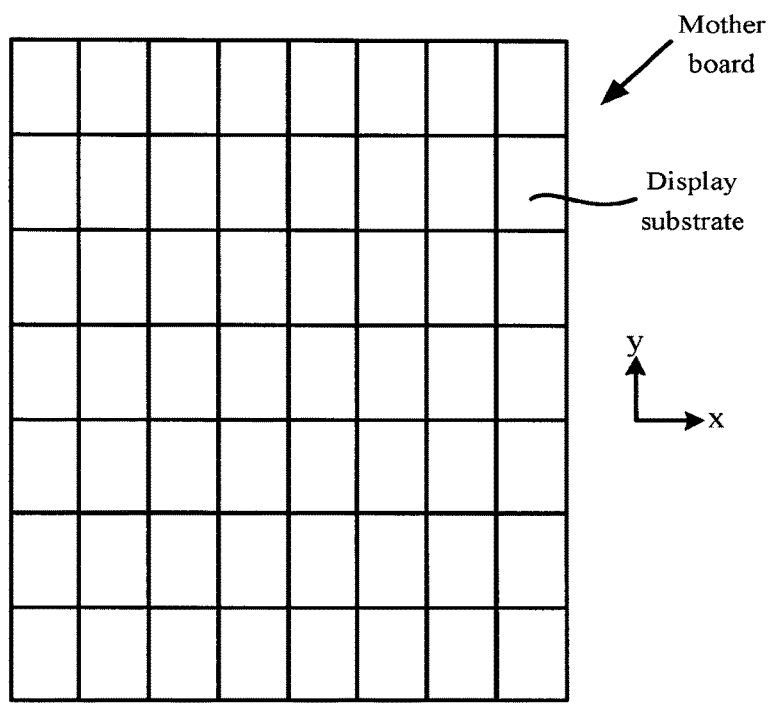
FIG. 1 to FIG. 4 show schematic views for forming an organic light emitting layer through evaporation in the prior art.

As shown in FIG. 1, the mother board comprises a plurality of substrates. The evaporation source (not shown) is a linear source extending along a second direction (e.g., y direction), and is moved in a first direction (e.g., x direction) intersecting with the second direction. After materials in the evaporation source are evaporated, a desired area on each substrate is formed by a mask plate.

Figure 2:
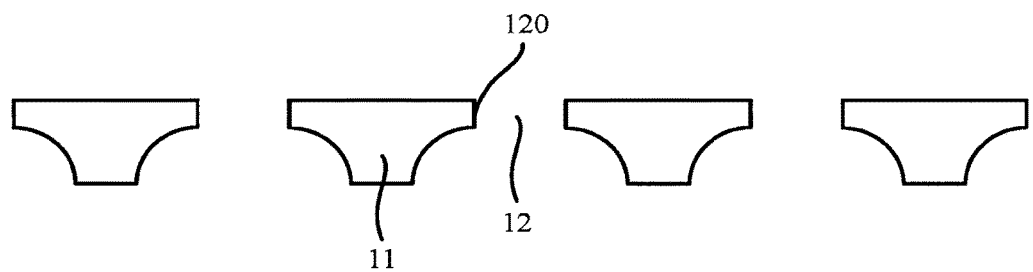

FIG. 2 shows a sectional view of a mask plate used in the prior art. As shown in FIG. 2, the mask plate can comprise a plurality of blocking areas 11 and a transmission area 12 between the blocking areas 11. The top edge of the cross section of the blocking area 11 has a length greater than the bottom edge. In addition, due to limitations in the manufacturing process, the top portion of the blocking area 11 has a certain thickness. That is, the cross section of the blocking area 11 has a side edge 120 connected with the top edge thereof and substantially perpendicular to the lower surface of the base.

Figure 3:
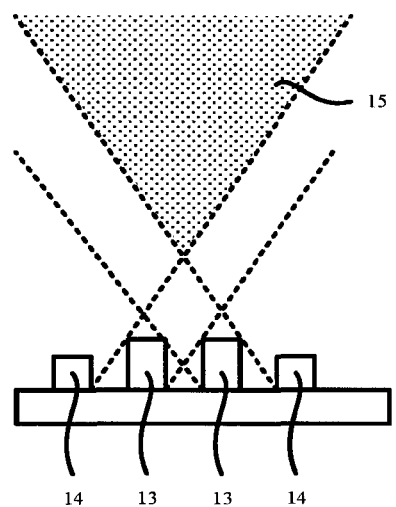

In the evaporation device, middle baffles 13 are arranged at two sides of the evaporation source, and doping materials are arranged between the middle baffles 13 and the side baffles 14. In this way, an evaporation area 15 of the evaporation source can be formed, as shown in FIG. 3. When the middle baffles 13 and the side baffles 14 are arranged in the evaporation device, the evaporation area 15 formed is determined. In addition, the border of the evaporation area 15 formed can be adjusted by tuning the height of the middle baffle 13 as well as the distance between the middle baffle 13 and the side baffle 14 appropriately.

Figure 4:
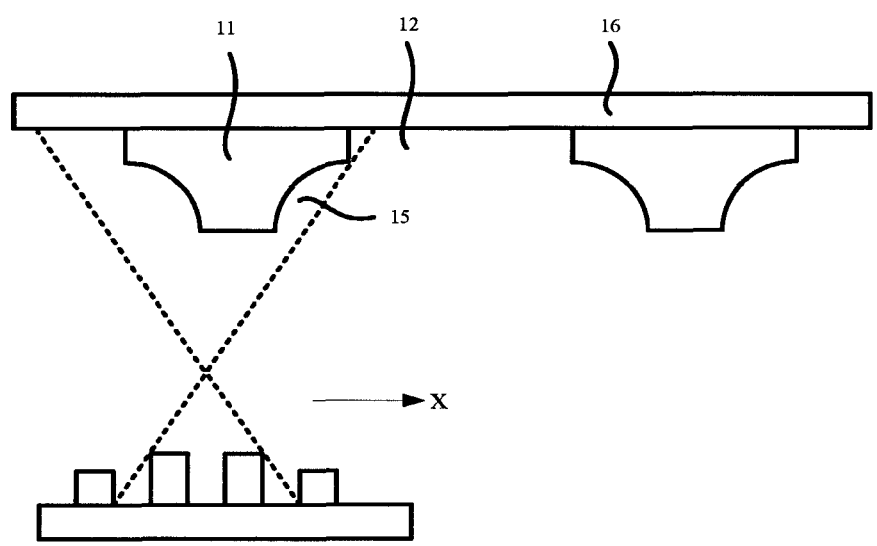

In the evaporation process of the prior art, as shown in FIG. 4, when the evaporation source moves along the first direction (e.g., x direction), because the top portion of the blocking area 11 has a certain thickness (i.e., the side edge 120 exists), the border of the evaporation area 15 will be blocked when the first border (e.g., the right side border of the evaporation area 15 as shown in the figure) of the evaporation area 15 enters the transmission area 12 of the mask plate. Thus, the evaporation area 15 cannot perform evaporation on the part of the lower surface of the base 16 close to the blocking area 11. In addition, the above problem also exists when the second border (e.g., the left side border of the evaporation area 15 as shown in the figure) of the evaporation area 15 leaves the transmission area 12. Therefore, according to the evaporation method in the prior art, the organic light emitting layer formed in the transmission area 12 has a cross-sectional shape with a relatively thick middle area and relatively thin side areas. This enables the organic light emitting layer to have a non-uniform thickness. For a single pixel formed, this may result in different light emitting brightness in different areas. While for a plurality of pixels, this may result in problems such as color mixture (or color bias).

Figure 5:
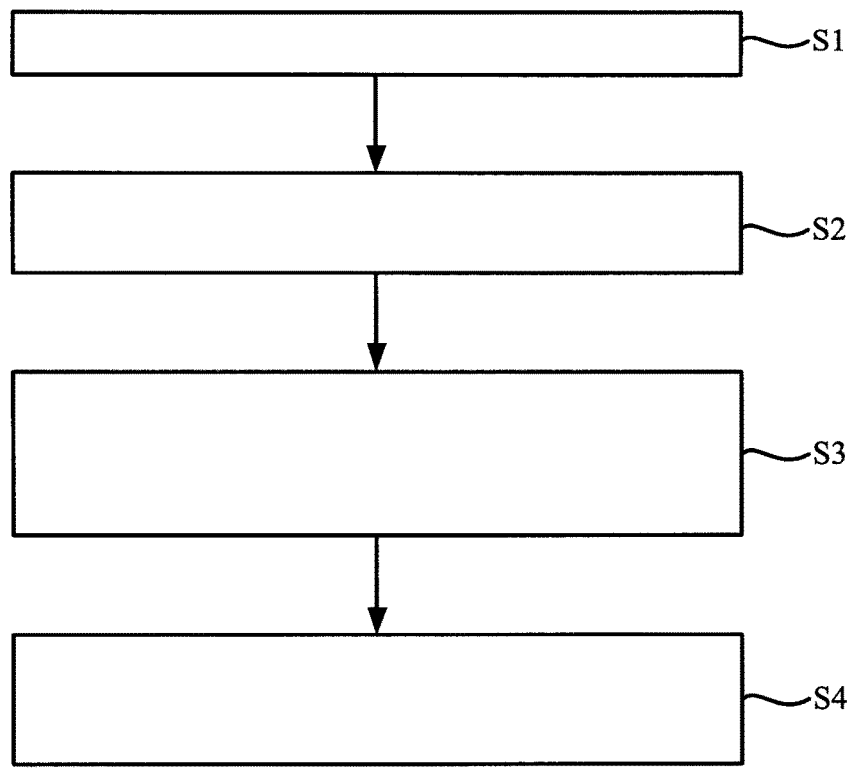
FIG. 5 shows a schematic flow chart of a method for manufacturing a display substrate according to an embodiment of the present disclosure.

FIG. 5 shows a schematic flow chart of a method for manufacturing a display substrate according to an embodiment of the present disclosure.

As shown in FIG. 5, the method for manufacturing a display substrate according to an embodiment of the present disclosure can comprise the following steps: S1, forming a pixel definition layer on a lower surface of a base so as to define a pixel area; S2, forming a spacer on a lower surface of the pixel definition layer; S3, arranging a mask plate under the spacer; and S4, moving an evaporation source along a first direction parallel to the lower surface of the base, so as to form an organic light emitting layer in the pixel area.

FIG. 6 to FIG. 10 show schematic sectional views of steps in the method for manufacturing a display substrate according to an embodiment of the present disclosure. Next, the steps as shown in FIG. 5 will be explained in detail with reference to FIG. 6 to FIG. 10.

Figure 6:
FIG. 6 to FIG. 10 show schematic sectional views of steps in the method for manufacturing a display substrate according to an embodiment of the present disclosure.

Referring to FIG. 5 and FIG. 6, a pixel definition layer 2 can be formed on the lower surface of a base 1 so as to define a pixel area. The pixel area is an area in which an organic light emitting layer is to be formed. A material layer for forming the pixel definition layer 2 can be deposited, sputtered or coated, and then etched to form the pixel definition layer 2.

Figure 7:
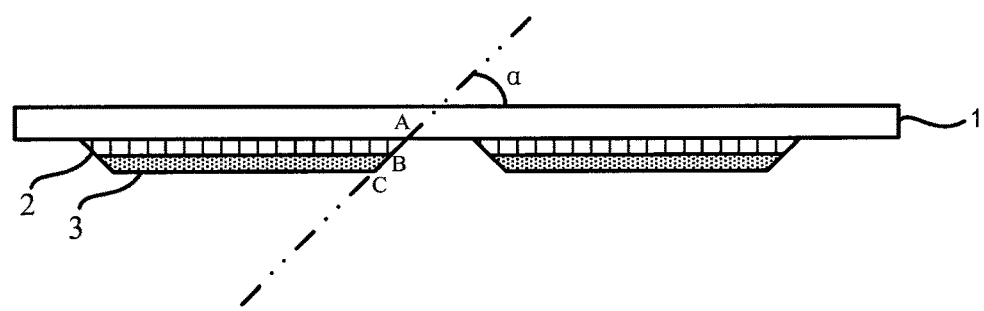

Referring to FIG. 5 and FIG. 7, a spacer 3 can be formed on the lower surface of the pixel definition layer 2. As shown in FIG. 7, the acute angle between the side surface B of the pixel definition layer 2 in a first direction (i.e., the moving direction of the evaporation source for forming the organic light emitting layer) for defining the pixel area and the lower surface of the base 1 is a first angle α.

As shown in FIG. 7, the side surface C of the spacer 3 in the first direction and the corresponding side surface B of the pixel definition layer 2 are located in the same plane. That is, the acute angle between the side surface C of the spacer 3 in the first direction and the lower surface of the base 1 is the first angle α. However, the embodiments of the present disclosure are not limited to this. The side surface C of the spacer 3 in the first direction can be not in the same plane as the corresponding side surface B of the pixel definition layer 2. That is, the acute angle between the side surface C of the spacer 3 in the first direction and the lower surface of the base 1 can be greater than or equal to the first angle α.

The material layer for forming the pixel definition layer 2 and the material layer for forming the spacer 3 can be stacked (e.g., deposited, sputtered or coated) in sequence on the lower surface of the base 1. Then, the pixel definition layer 2 and the spacer 3 on the lower surface thereof are formed through one etching process. In such a case, the side surface C of the formed spacer 3 in the first direction and the corresponding side surface B of the pixel definition layer 2 can be located in the same plane. However, the embodiments of the present disclosure are not limited to this. The pixel definition layer 2 and the spacer 3 on the lower surface thereof can be formed respectively. In such a case, the side surface C of the spacer 3 in the first direction can be not in the same plane as the corresponding side surface B of the pixel definition layer 2.

Figure 8:
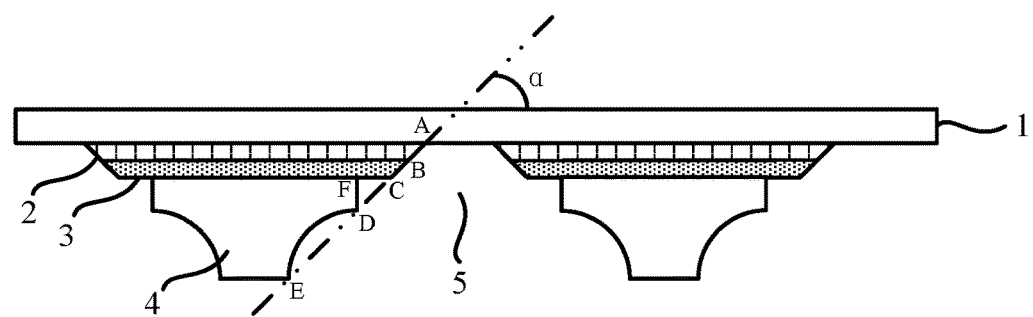

Referring to FIG. 5 and FIG. 8, a mask plate can be arranged under the spacer 3. Similar to the mask plate as shown in FIG. 2, the mask plate as shown in FIG. 8 can comprise a plurality of blocking areas 4 and a transmission area 5 between the blocking areas 4. The top edge of the cross section of the blocking area 4 has a length greater than the length of the bottom edge. In addition, due to limitations in the manufacturing process, the top portion of the blocking area 4 has a certain thickness. That is, the cross section of the blocking area 4 has a side edge DF connected with the top edge thereof and substantially perpendicular to the lower surface of the base 1. In addition, the bottom edge of the cross section of the blocking area 4 has an endpoint E close to the side edge DF. In the cross section of the blocking area 4, the connecting line between the endpoint D and the endpoint E can be located within a plane where the side surface B of the pixel definition layer 2 and the side surface C of the spacer 3 locate, as shown in FIG. 8. However, the present disclosure is not limited to this.

Figure 9:
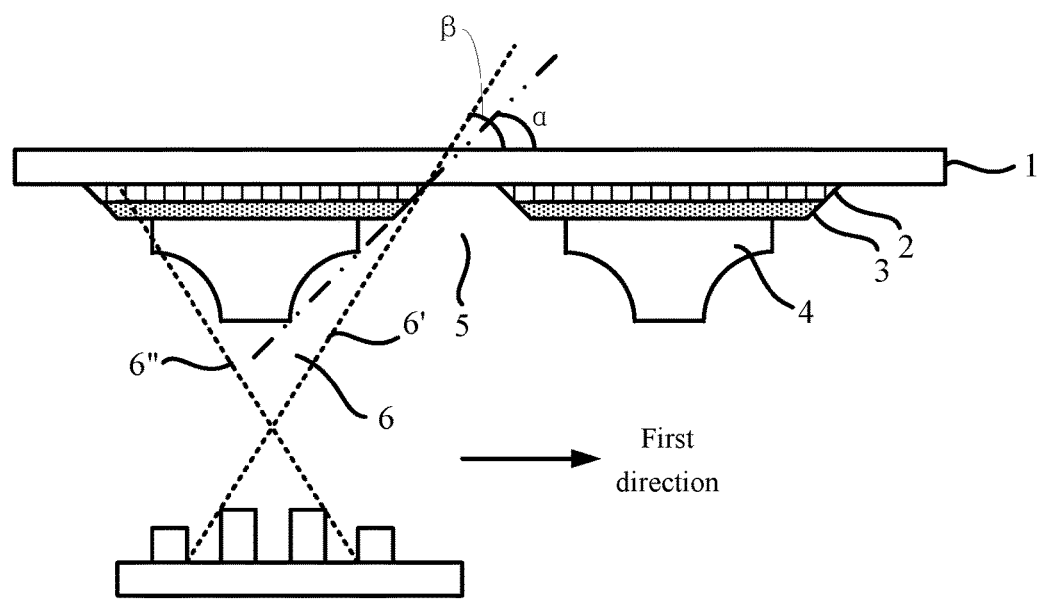

Referring to FIG. 5 and FIG. 9, the evaporation source can be moved along the first direction (e.g., the x direction as shown in FIG. 1) parallel to the lower surface of the base 1, so as to form an organic light emitting layer in the pixel area. The acute angle between the border 6' or 6" of the evaporation area 6 of the evaporation source in the first direction and the lower surface of the base 1 is a second angle β, and the second angle β can be greater than or equal to the first angle α.

Figure 10:
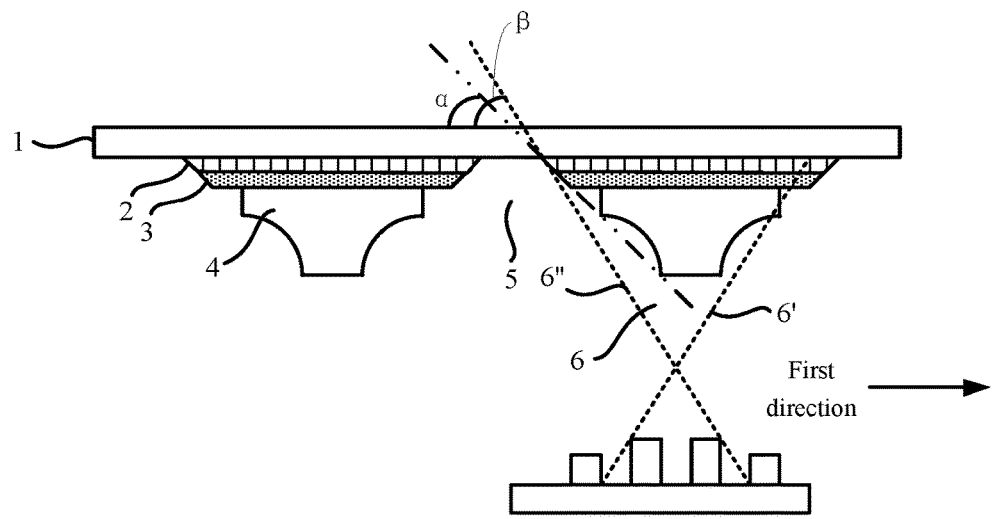

As shown in FIG. 9, when the evaporation source is moved in the first direction so as to start forming the organic light emitting layer in the pixel area, the spacer 3 under the pixel definition layer 2 and the mask plate under the spacer 3 do not block the first border 6' of the evaporation area 6. As shown in FIG. 10, when the evaporation source is moved in the first direction so as to stop forming the organic light emitting layer in the pixel area, the spacer 3 under the pixel definition layer 2 and the mask plate under the spacer 3 do not block the second border 6" of the evaporation area 6.

According to the current embodiment, because the second angle β is greater than or equal to the first angle α, it can be ensured that the first border 6' of the evaporation area 6 will not be blocked by the side edge DF of the blocking area 4 when the first border 6' of the evaporation area 6 starts forming the organic light emitting layer in the pixel area through the transmission area 5. This ensures to start forming the organic light emitting layer from the interface between the pixel definition layer 2 and the lower surface of the base 1. Hence, it enables the thickness of the formed organic light emitting layer to be uniform and the light emitting brightness of all areas in the pixels to be same. This helps to ensure the display substrate to have no color mixture on the whole.

Figure 11:
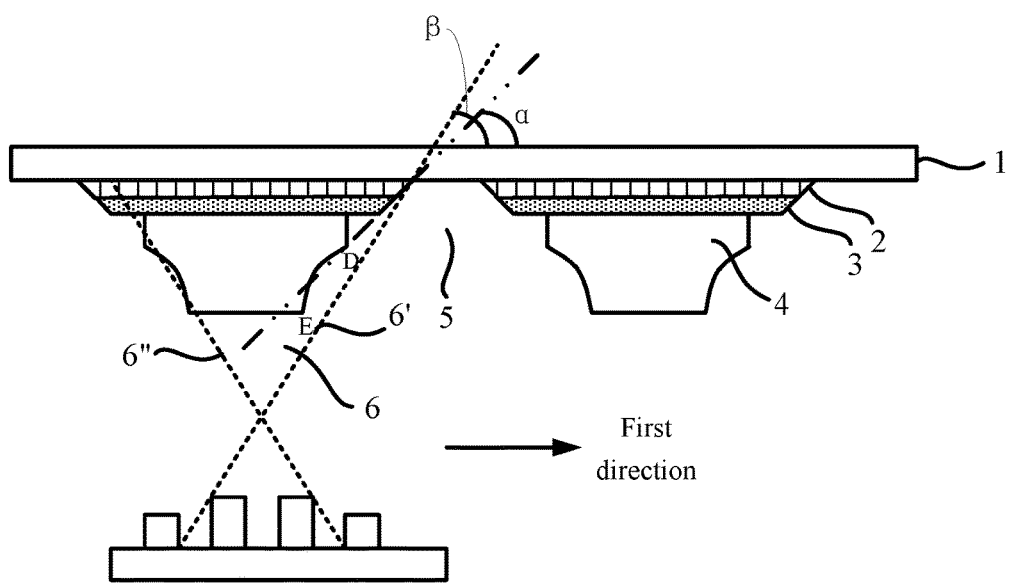
FIG. 11 shows a schematic view for the movement of an evaporation source according to another embodiment of the present disclosure.

FIG. 11 shows a schematic view for the movement of an evaporation source according to another embodiment of the present disclosure.

As shown in FIG. 11, in the cross section of the blocking area 4, the connecting line between the endpoint D and the endpoint E is not located in a plane where the side surface B of the pixel definition layer 2 and the side surface C of the spacer 3 locate. However, it does not influence application of the method for manufacturing a display substrate according to the embodiments of the present disclosure to manufacture a display substrate with an organic light emitting layer of a uniform thickness.

As shown in FIG. 11, when the evaporation source is moved in the first direction so as to start forming the organic light emitting layer in the pixel area, the spacer 3 under the pixel definition layer 2 and the mask plate under the spacer 3 do not block the first border 6' of the evaporation area 6. This helps to enable the formed organic light emitting layer to have a uniform thickness.

According to an embodiment of the present disclosure, the evaporation source can be a linear source extending along a second direction (e.g., y direction as shown in FIG. 1) parallel to the lower surface of the base 1 and perpendicular to the first direction. Baffles can be arranged at two sides of the evaporation source, for enabling the acute angle between the border 6' or 6" of the evaporation area 6 in the first direction and the lower surface of the base 1 to be the second angle β. The desired second angle β can be obtained by adjusting the height of the baffle and the distance between the baffles.

According to an embodiment of the present disclosure, side surfaces of the pixel definition layer 2 and the spacer 3 formed there-under in the second direction can be perpendicular to the lower surface of the base 1. According to the current embodiment, the evaporation source is a linear source extending along the second direction. That is, the baffle only has definition function on the evaporation area 6 in the first direction, and the pixel definition layer 2 and the spacer 3 would hardly block the evaporation area 6 in the second direction. Hence, there is no need for defining side surfaces of the pixel definition layer 2 and the spacer 3 in the second direction.

Figure 12A:
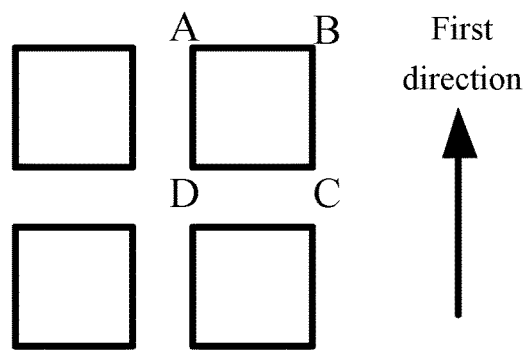
FIG. 12A and FIG. 12B show pixel examples that can use the method for manufacturing a display substrate according to an embodiment of the present disclosure.
Figure 12B:
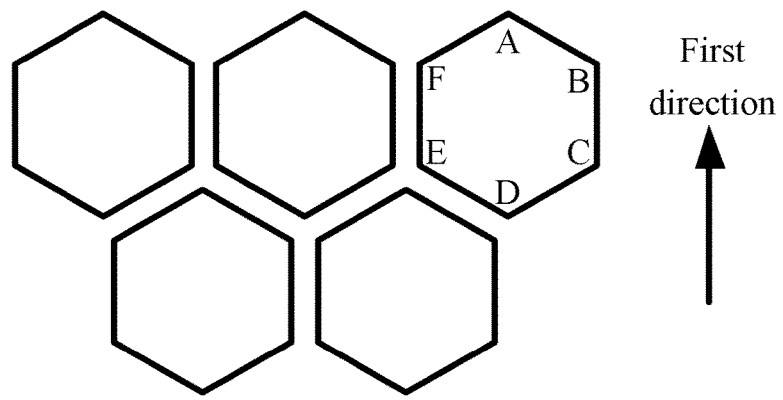

FIG. 12A and FIG. 12B show pixel examples that can use the method for manufacturing a display substrate according to an embodiment of the present disclosure.

As shown in FIG. 12A, the edges AD and BC of the rectangular pixel are parallel to the first direction (i.e., the moving direction of the evaporation source). Besides, the side surface of the pixel definition layer and the side surface of the spacer corresponding to the edges AD and BC can be set to be perpendicular to the lower surface of the base. Further, the side surface of the pixel definition layer and the side surface of the spacer corresponding to the edges AB and CD can be set with reference to the above embodiments, such that the acute angle with relative to the lower surface of the base is the first angle α. As shown in FIG. 12B, the edges EF and BC of the hexagonal pixel are parallel to the first direction (i.e., the moving direction of the evaporation source). Besides, the side surface of the pixel definition layer and the side surface of the spacer corresponding to the edges EF and BC can be set to be perpendicular to the lower surface of the base. Further, the side surface of the pixel definition layer and the side surface of the spacer corresponding to the edges AB, AF, CD and DE can be set with reference to the above embodiments, such that the acute angle with relative to the lower surface of the base is the first angle α. Thereby, the process for forming the pixel definition layer and the spacer is simplified.

According to an embodiment of the present disclosure, the second angle β can be equal to the first angle α.

The smaller the evaporation area angle (i.e., the second angle β) is, the higher the uniformity of the organic light emitting layer obtained from evaporation will be. According to the current embodiment, the evaporation area angle (i.e., the second angle β) can be minimum, while the above embodiment effect is ensured to be achieved. Thereby, the thickness uniformity of the formed organic light emitting layer is ensured to the greatest extent.

Figure 13:
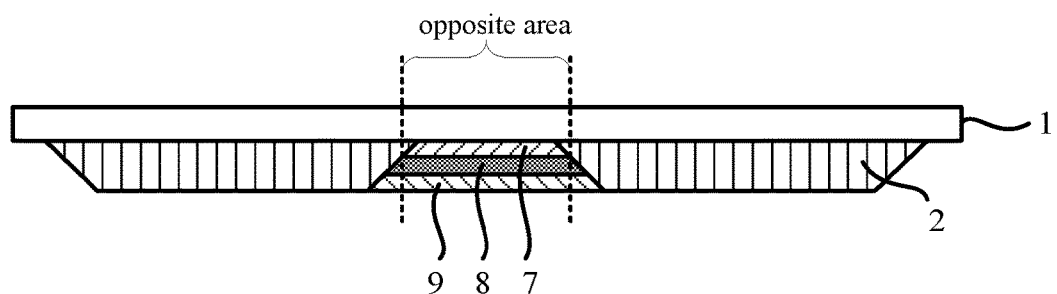
FIG. 13 shows a schematic sectional view of a display substrate manufactured by the method for manufacturing a display substrate according to an embodiment of the present disclosure.

FIG. 13 shows a schematic sectional view of a display substrate manufactured by the method for manufacturing a display substrate according to an embodiment of the present disclosure.

According to an embodiment of the present disclosure, the method can further comprise: prior to forming the organic light emitting layer 8, forming a first electrode 7 on the lower surface of the base 1, and after forming the organic light emitting layer 8, forming a second electrode 9 on a lower surface of the organic light emitting layer 8.

The opposite area of the first electrode 7 and the second electrode 9 corresponds to an electrode with a smaller area of the two (e.g., the first electrode 7). In the method for manufacturing a display substrate according to an embodiment of the present disclosure, it can be ensured that the organic light emitting layer 8 in the opposite area has a uniform thickness.

The display substrate according to an embodiment of the present disclosure can comprise: a base 1; a pixel definition layer 2 formed on a lower surface of the base, for defining a pixel area; a spacer 3 (not shown in FIG. 13) formed on a lower surface of the pixel definition layer 2; and an organic light emitting layer 8 formed in the pixel area. An acute angle between a side surface of the pixel definition layer 2 in a first direction parallel to the lower surface of the base 1 for defining the pixel area and the lower surface of the base 1 is a first angle. Further, a cross section of the organic light emitting layer 8 perpendicular to the lower surface of the base 1 and parallel to the first direction is a trapezoid, wherein a side length thereof close to the lower surface of the base 1 is less than a side length thereof away from the lower surface of the base 1, as shown in FIG. 13.

According to an embodiment of the present disclosure, side surfaces of the pixel definition layer 2 and the spacer 3 (not shown in FIG. 13) formed there-under in a second direction parallel to the lower surface of the base 1 and perpendicular to the first direction can be perpendicular to the lower surface of the base 1.

According to an embodiment of the present disclosure, the display substrate can further comprise: a first electrode 7 arranged between the lower surface of the base 1 and the organic light emitting layer 8; and a second electrode 9 arranged on a lower surface of the organic light emitting layer 8.

The display device according to an embodiment of the present disclosure can comprise the display substrate according to any of the above embodiments of the present disclosure. It should be noted that the display device in the current embodiment can be any product or component with the display function such as electronic paper, a mobile phone, a tablet computer, a television, a laptop computer, a digital photo frame, a navigator etc.

The technical solution of the present disclosure has been explained in detail above with reference to the drawings. It should be pointed out that in the drawings, sizes of the layers and areas might be exaggerated for the clarity of illustration. Moreover, it can be understood, when it is stated that an element or layer is "above" or "under" another element or layer, the element or layer can be directly above or under the other element or layer, or one or more middle elements or layers may exist. In addition, it can also be understood, when it is stated that an element or layer is "between" two elements or two layers, the element or layer can be the unique element or layer between two elements or two layers, or one or more middle elements or layers may exist. In the context, the same or similar reference signs are used for representing the same or similar elements all along.

It should be understood that although terms such as "first", "second" can be used for describing different elements in this text, these elements should not be limited by these terms. These terms are only used for distinguishing one element from another. For example, the "first element" can also be called the 'second element" without departing from the teaching of the embodiments. The term "a plurality of" refers to two or more, unless otherwise expressly defined.

What are stated above are only preferred embodiments of the present disclosure, and are not used for limiting the present disclosure. For the skilled person in the art, the present disclosure can have various modifications and variations. Any amendment, equivalent replacement, improvement, and the like made within the spirit and the principle of the present disclosure should be encompassed within the protection scope of the present disclosure.

The invention claimed is:

1. A method for manufacturing a display substrate, comprising:
   forming a pixel definition layer on a lower surface of a base so as to define a pixel area;
   forming a spacer on a lower surface of the pixel definition layer;
   arranging a mask plate under the spacer; and
   moving an evaporation source along a first direction parallel to the lower surface of the base, so as to form an organic light emitting layer in the pixel area, wherein
   an acute angle between a side surface of the pixel definition layer in the first direction for defining the pixel area and the lower surface of the base is a first angle,
   an acute angle between a border of an evaporation area of the evaporation source in the first direction and the lower surface of the base is a second angle, the second angle being greater than or equal to the first angle, and
   when the evaporation source is moved in the first direction so as to start forming the organic light emitting layer in the pixel area, the spacer under the pixel definition layer and the mask plate under the spacer do not block a first border of the evaporation area, and when the evaporation source is moved in the first direction so as to stop forming the organic light emitting layer in the pixel area, the spacer under the pixel definition layer and the mask plate under the spacer do not block a second border of the evaporation area.

2. The method according to claim 1, wherein
   the evaporation source is a linear source extending along a second direction parallel to the lower surface of the base and perpendicular to the first direction, and
   baffles are arranged at two sides of the evaporation source, for enabling the acute angle between the border of the evaporation area in the first direction and the lower surface of the base to be the second angle.

3. The method according to claim 2, wherein
   side surfaces of the pixel definition layer and the spacer formed there-under in the second direction are perpendicular to the lower surface of the base.

4. The method according to claim 3, further comprising:
   prior to forming the organic light emitting layer, forming a first electrode on the lower surface of the base, and
   after forming the organic light emitting layer, forming a second electrode on a lower surface of the organic light emitting layer.

5. The method according to claim 2, further comprising:
   prior to forming the organic light emitting layer, forming a first electrode on the lower surface of the base, and
   after forming the organic light emitting layer, forming a second electrode on a lower surface of the organic light emitting layer.

6. The method according to claim 1, wherein the second angle is equal to the first angle.

7. The method according to claim 6, further comprising:
prior to forming the organic light emitting layer, forming a first electrode on the lower surface of the base, and
after forming the organic light emitting layer, forming a second electrode on a lower surface of the organic light emitting layer.

8. The method according to claim 1, further comprising:
prior to forming the organic light emitting layer, forming a first electrode on the lower surface of the base, and
after forming the organic light emitting layer, forming a second electrode on a lower surface of the organic light emitting layer.

* * * * *